United States Patent
Zuniga et al.

(10) Patent No.: US 9,362,388 B1
(45) Date of Patent: Jun. 7, 2016

(54) TESTING OF LDMOS DEVICE

(75) Inventors: Marco A. Zuniga, Palo Alto, CA (US); Craig Cassella, Fremont, CA (US)

(73) Assignee: Volterra Semiconductor LLC, San Jose, CA (US)

(*) Notice: Subject to any disclaimer, the term of this patent is extended or adjusted under 35 U.S.C. 154(b) by 1336 days.

(21) Appl. No.: 13/208,204

(22) Filed: Aug. 11, 2011

Related U.S. Application Data

(60) Provisional application No. 61/373,802, filed on Aug. 13, 2010.

(51) Int. Cl.
*G01R 31/02* (2006.01)
*H01L 29/66* (2006.01)

(52) U.S. Cl.
CPC .................. *H01L 29/66901* (2013.01)

(58) Field of Classification Search
None
See application file for complete search history.

(56) References Cited

U.S. PATENT DOCUMENTS

| | | | | |
|---|---|---|---|---|
| 4,918,333 A | * | 4/1990 | Anderson et al. | 326/32 |
| 4,924,112 A | * | 5/1990 | Anderson et al. | 326/32 |
| 5,591,996 A | * | 1/1997 | Haigh et al. | 257/238 |
| 6,049,213 A | * | 4/2000 | Abadeer | 324/719 |
| 6,486,692 B1 | * | 11/2002 | Chen | H01L 22/34 324/71.1 |
| 6,756,806 B1 | * | 6/2004 | Yang et al. | 324/762.09 |
| 6,943,572 B2 | * | 9/2005 | Desplats et al. | 324/750.16 |
| 7,670,889 B2 | * | 3/2010 | Pekarik | H01L 29/66901 438/151 |

OTHER PUBLICATIONS

"High Voltage Trench Drain LDMOS-FET Using SOI Wafer" by Baba et al. May 31-Jun. 3, 1994 (pp. 1-4).*

* cited by examiner

*Primary Examiner* — Paresh Patel
(74) *Attorney, Agent, or Firm* — Lathrop & Gage LLP

(57) ABSTRACT

A method for testing an LDMOS transistor by measuring leakage current between the source and drain in the presence of a bias voltage. The leakage current is indicative of defects in the structure of the transistor.

9 Claims, 16 Drawing Sheets

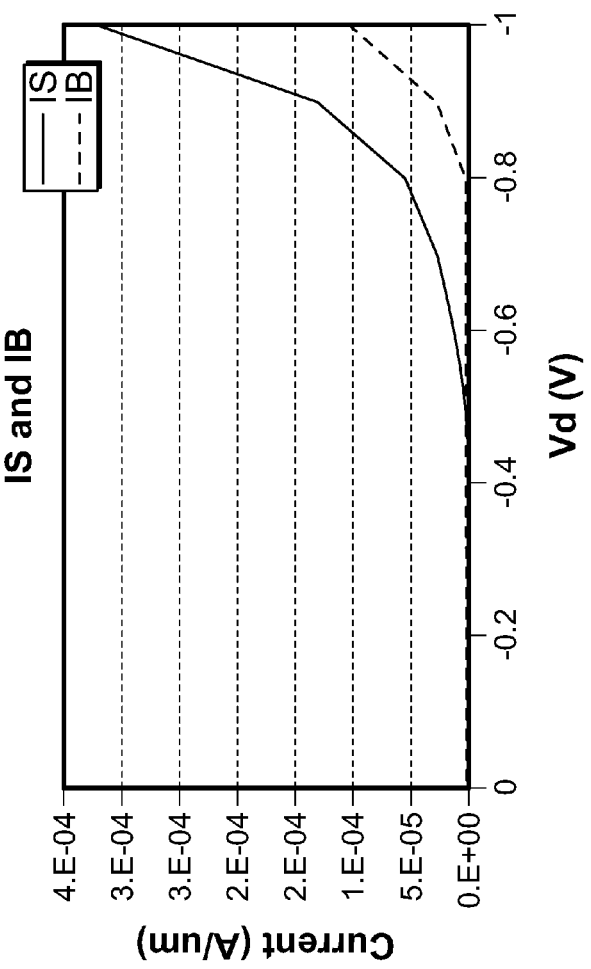

| S/N | Species | Energy | Tilt | Dose | Rotate | Vt |
|---|---|---|---|---|---|---|
| 1 | Ph | 70 | 7 | 1.125E+13 | 22.5 | |
| 2 | Ph | 70 | 15 | 12E+14 | 22.5 | 0.45 |

| S/N | Species | Energy | Tilt | Dose | Rotate | Vt (V) |
|---|---|---|---|---|---|---|
| 1 | Ph | 70 | 7 | 1.125E+13 | 22.5 | |
| 2 | Ph | 70 | 15 | 12E+13<br>1E+13<br>1E+12 | 22.5 | 1.8<br>0.8<br>0.7 |

TESTING OF LDMOS DEVICE

CROSS-REFERENCE TO RELATED APPLICATIONS

This application claims priority to U.S. Provisional Application Ser. No. 61/373,802, filed on Aug. 13, 2010, the entirety of which is incorporated by reference.

TECHNICAL FIELD

The present disclosure relates generally to the testing of semiconductor devices, and more particularly to testing of a lateral double-diffused metal oxide semiconductor (LDMOS) device.

BACKGROUND

Voltage regulators, such as DC to DC converters, are used to provide stable voltage sources for electronic systems. Efficient DC to DC converters are particularly needed for power management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS (laterally diffused metal oxide semiconductor) transistors are used in switching regulators as a result of their specific on-resistance and drain-to-source breakdown voltage.

Production testing of LDMOS transistors involves ensuring that the on-resistance is appropriately low so that the operation of the device will be efficient. In addition, production testing involves ensuring that the leakage current (i.e. the current through the device when it is off) is not too high. High leakage current can be symptomatic of defects in the transistor. These defects might prevent the transistor from working correctly, or might cause the transistor to be unreliable over time.

Testing the leakage current of an LDMOS device generally involves keeping the device switched off, applying a voltage from the drain to the source, and measuring the resulting leakage current flowing from drain to source. The leakage current should measure within an expected range, in accordance with the design of the transistor. For example, a transistor whose voltage rating is lower will have a higher expected leakage current than an otherwise similar transistor with a higher voltage rating. Given all the design attributes of a transistor, a manufacturer can determine a bounded range of acceptable values for leakage current, outside of which a device should be deemed "defective" and should be discarded.

SUMMARY

For a transistor in which the turn-on voltage is less than the turn-on voltage of the intrinsic diode, it is advantageous to be able to measure leakage current with the same testing equipment that is used to test conventional transistors. Modifying the transistor's structure to reduce the turn-on voltage can increase the leakage current of the transistor. This complicates the detection of defects through leakage testing, because a low quiescent leakage current is essential to detect the additional leakage of a defect. During testing, the transistor can be strategically biased in order to reduce the likelihood of subthreshold currents flowing.

In one aspect, a method of characterizing a transistor having a gate and a channel comprises applying a negative voltage to the gate of the transistor; applying a positive voltage across the channel of the transistor, measuring current through the channel of the transistor while applying the negative voltage to the gate of the transistor and applying the positive voltage across the channel of the transistor; and determining whether the transistor is deemed defective based upon the measurement.

Implementations can include one or more of the following features. The transistor may be a power transistor. The transistor may be an LDMOS device. The transistor may have a threshold voltage lower than the turn-on voltage of an intrinsic diode of the transistor. The transistor may have a threshold voltage below 0.5 V. The transistor may have a channel width of at least one meter. Determining whether the transistor is deemed defective may include comparing the measured current to a threshold. Determining whether the transistor is deemed defective may include determining whether the measured current is within an acceptable range. The method may further comprise applying the negative voltage to gates of a plurality of transistors, applying the positive voltage across channels of the plurality of transistors, measuring a plurality of currents through the channels while applying the negative voltage to the gates and applying the positive voltage across the channels, and determining the acceptable range from the plurality of current measurements. Determining the acceptable range may include identifying a distribution in a histogram of the plurality of current measurements and selecting the threshold to exclude one or more current measurements of the plurality of current measurements that are outliers of the distribution.

In another aspect, a method of detecting defects in a transistor comprises introducing an electric field that reduces leakage current of the transistor, measuring the leakage current through the transistor while the electric field is introduced, comparing the leakage current to a threshold, and determining whether the transistor includes defects based on the comparison.

In an implementation, the electric field can be the result of a negative voltage introduced at the gate of said transistor.

In another aspect, a method of detecting defects in a transistor comprises introducing a gate voltage such that said transistor is less conductive than in its typical "off" state, and measuring a leakage current through said transistor.

In another aspect, a method of detecting defects in a transistor comprises the steps of introducing an electric field that disables the flow of leakage current directly under a gate oxide of said transistor, and measuring a leakage current through said transistor.

In another aspect, a method of reducing the time required to test the leakage current through a transistor comprises the steps of applying a negative voltage to the gate of said transistor, applying a voltage across the channel of said transistor, and measuring the current through said channel of said transistor.

In another aspect, a method of characterizing a transistor having a gate and a channel comprises applying a negative voltage approximately equal to −Vt to a power supply powering a driver which controls the gate of the transistor, wherein the transistor is an LDMOS transistor which is part of an integrated circuit and Vt is a turn-on voltage of the transistor, measuring current through said channel of said transistor while applying the negative voltage to the gate of the transistor and applying the positive voltage across the channel of the transistor, and determining whether the transistor is deemed defective based upon the measurement.

Implementations can include one or more of the following features. The transistor can be an LDMOS device. The transistor can have a threshold voltage lower than an turn-on voltage of an intrinsic diode of the transistor. The transistor can have a threshold voltage below 0.5 V. The transistor can have a channel width of at least one meter.

Certain implementations may have one or more of the following advantages. The testing of transistors for leakage current can be critical to controlling quality. Reducing subthreshold currents that flow during leakage measurement can enable more accurate detection of defects within the device. Increasing the margin of leakage current between quality transistors and defective transistors reduces the need for high accuracy and permits faster measurements by automated testing equipment. Using the gate voltage to modulate subthreshold leakage current can enhance production yield by discriminating between defective and non-defective transistors.

BRIEF DESCRIPTION OF THE DRAWINGS

FIGS. 7A and 7B are a chart, and corresponding graph, showing the characteristics of a transistor having a thin gate oxide thickness of 35 Å.

Like reference numbers and designations in the various drawings indicate like elements.

DETAILED DESCRIPTION

Figure 1:
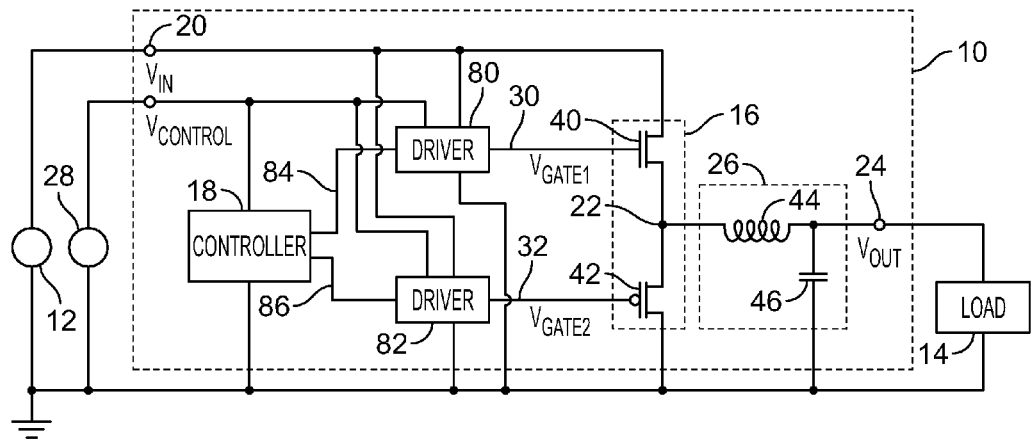
FIG. 1 is a circuit diagram of a buck converter.

When a transistor is used in synchronous rectification in a switching regulator, efficiency losses occur as a result of reverse recovery of the intrinsic body diode charge up during deadtime, as well as diode conduction during deadtime. By having a transistor in which the turn-on voltage of the transistor is less than the turn-on voltage of the intrinsic diode, the efficiency of the switching regulator can be enhanced by reducing both mechanisms of loss associated with parasitic diodes. The lower threshold voltage prevents minority carrier storage. Moreover, the conduction losses during deadtime will decrease by the ratio of threshold voltage to diode turn-on voltage.

When an LDMOS transistor is fabricated, it should be tested to ensure that the on-resistance is appropriately low so that the operation of the device will be efficient. In addition, production testing involves ensuring that the leakage current (i.e. the current through the device when it is off) is not too high. For example, some transistors that are designed for high current are tested with the expectation of leakage current that falls below 250 nA (for a 1 meter channel width; leakage current would be proportional to channel width). If such a transistor has a defect, the leakage current can increase to several microamps or more, which is approximately one order of magnitude greater than the leakage current of a "good" device. Measuring such small currents requires precision testing equipment, and may be slow because of "settling times" required to stabilize the testing equipment. Such settling times equate to delays in the production environment, which increases cost. But the wide margin between conventional "good" transistors (whose leakage current is on the order of, for example, 250 nA) and "bad" parts (whose leakage current is on the order of, for example, 3 µA) is advantageous for testing. With such a wide margin between "good" and "bad" leakage measurements, the measurement can be made more quickly, with less accuracy, while still preserving the discriminatory nature of the test.

For a transistor in which the turn-on voltage is less than the turn-on voltage of the intrinsic diode, it is advantageous to be able to measure leakage current with the same testing equipment that is used to test conventional transistors. Modifying the transistor's structure to manipulate the turn-on voltage can affect the leakage current of the transistor. For example, in some embodiments of transistors with low turn-on voltage, the transistor may permit subthreshold currents to flow between the drain and source when the drain is at 12 V and the the source and gate are at 0 V. These subthreshold currents may be on the order of 3 µA or more, depending upon bias conditions. Because of this high subthreshold current, it is difficult to measure the intrinsic leakage current of the transistor. During testing, the transistor can be strategically biased in order to reduce the likelihood of subthreshold currents flowing.

Referring to FIG. 1, a switching regulator 10 is coupled to a first high DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 may include a first transistor 40, called a high-side transistor, having a source connected to the input terminal 20 and a drain connected to the intermediate terminal 22 and a second transistor 42, called a low-side transistor, or synchronous transistor, having a source connected to ground and a drain connected to the intermediate terminal 22.

In one implementation, the first transistor 40 can be a Positive-Channel Metal Oxide Semiconductor (PMOS) transistor, and the second transistor 42 can be a Negative-Channel Metal Oxide Semiconductor (NMOS) transistor. In another implementation, the first transistor 40 and the second transistor 42 can both be NMOS transistors. In another implementation, the first transistor 40 can be a PMOS, NMOS, or a Lateral Double-diffused Metal Oxide Semiconductor (LDMOS), and the second transistor 42 can be an LDMOS.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 44 connected between the intermediate terminal 22 and the output terminal 24 and a capacitor 46 connected in parallel with the load 14. During a high-side conduction period, the first transistor is closed, and the source 12 supplies energy to the load 14 and the inductor 44 via the first transistor 40. On the other hand, during a low-side conduction period, the second transistor 42 is closed, and current flows through the second transistor 42 as energy is supplied by the inductor 44. The resulting output voltage $V_{out}$ is a substantially DC voltage.

The switching regulator also includes a controller 18, a high-side driver 80 and a low-side driver 82 for controlling the operation of the switching circuit 16. A first control line 30 connects the high-side transistor 40 to the high-side driver 80, and a second control line 32 connects the low-side transistor 42 to the low-side driver 82. The high-side and low-side drivers are connected to the controller 18 by control lines 84 and 86, respectively. The controller 18 causes the switching circuit 16 to alternate between high-side and low-side conduction periods so as to generate an intermediate voltage $V_{int}$ at the intermediate terminal 22 that has a rectangular waveform. The controller 16 can also include a feedback circuit (not shown), which measures the output voltage and the current passing through the output terminal. Although the controller 18 is typically a pulse width modulator, the invention is also applicable to other modulation schemes, such as pulse frequency modulation.

Figure 2:
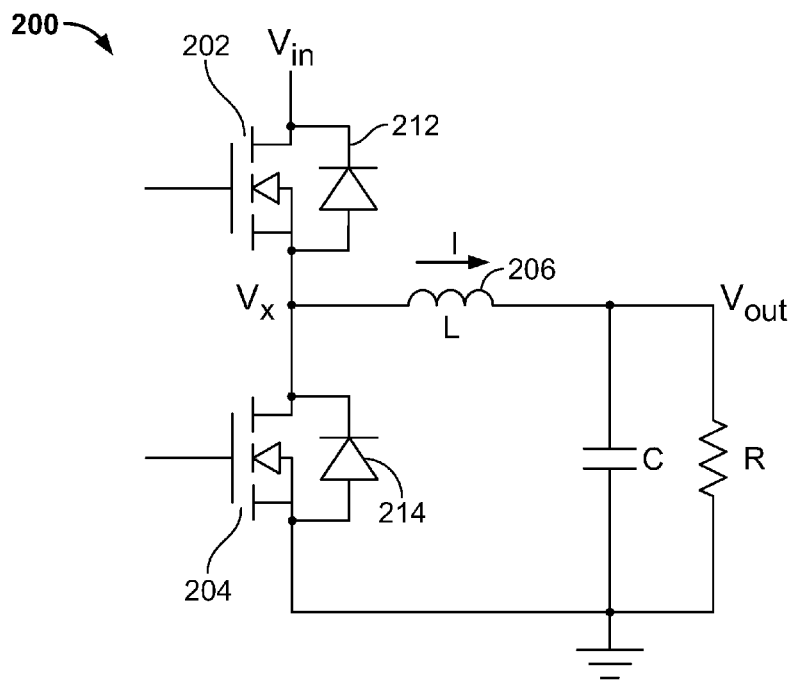
FIG. 2 is a simplified circuit diagram of a buck converter.

A simplified circuit diagram of a buck converter 200 is shown in FIG. 2. The buck converter 200 includes a high-side transistor 40, a low-side transistor 42, and an inductor 206. Each transistor has a corresponding intrinsic body diode, 212 and 214, respectively. A voltage $V_{in}$, for example 12V, is applied to the high-side transistor 40, and when the high-side transistor 40 is on, current will flow through the transistor 40 and the inductor 206. In contrast, when the low-side transistor 42 is on, the inductor 206 will pull current from ground. Under normal operation of the buck circuit 200, the regulator will switch between turning the high-side transistor 40 and the low-side transistor 42 on so that the output of the filter 26 produces the desired voltage $V_{out}$ ($V_{out}$ somewhere between 0V and $V_{in}$).

To improve efficiency of the buck converter 200, it is desirable to have the high-side transistor 40 on while the low-side transistor 42 is off, and vice versa. However, some downtime is required between the switching in order to avoid having both transistors 40, 42 on and at same time, which can cause shoot-through and result in significant efficiency losses and damage to the transistors. Thus, there is a short period, the intrinsic deadtime $t_d$, between each high-side conduction and low-side conduction period in which both transistors are open.

When both transistors 40, 42 are off, current through the inductor 206 will not instantly drop to zero. The voltage across the inductor is determined by Equation 1:

$$V=L(di/dt),\qquad\text{(Equation 1)}$$

where V is the voltage, L is the inductance, and i is the current in the inductor. As the inductor current decreases, the voltage at the input end, i.e. near $V_{in}$, of the inductor is forced to be negative. When this voltage reaches approximately −0.7 V, the low-side body diode 214 reaches its threshold voltage and begins conducting current into the inductor. As a result, in a traditional buck converter, the current will travel through the diode 214.

When the current flows through the low-side diode, a number of losses in efficiency can result. The most significant loss is associated with reverse recovery. The reverse recovery loss is the loss associated with taking the forward conducting diode from forward to reverse bias. Reverse recovery occurs when the high-side transistor is switched on. In the period before the high-side transistor is switched on, the low-side body diode is forward biased with the inductor drawing current through the diode from ground. In this state, the PN junction of the low-side diode conducts, the depletion region is narrowed to its minimum width, and a buildup of charge carriers is formed on each side of the diode's PN junction. When the high-side transistor is switched on, the low-side diode goes from being forward biased at 0.7 V to being negative biased at −12 V. However, the low-side diode does not instantaneously switch off because the same buildup of charge carriers that allowed conduction across the PN junction during forward bias causes a transient charge to be depleted in negative bias. The reverse recovery loss is thus a current that flows through the high-side transistor in order to restore the equilibrium reverse-biased charge across the low-side's PN junction.

For some embodiments of buck converters and other voltage regulators, the high-side transistor and the low-side transistor may be inseparably fabricated on one substrate, so that the source of the high-side transistor is permanently attached to the drain of the low-side transistor. In this case, testing the device requires connecting equipment to the external contacts of the device, for example Vin, Vx, and ground.

Figure 3:
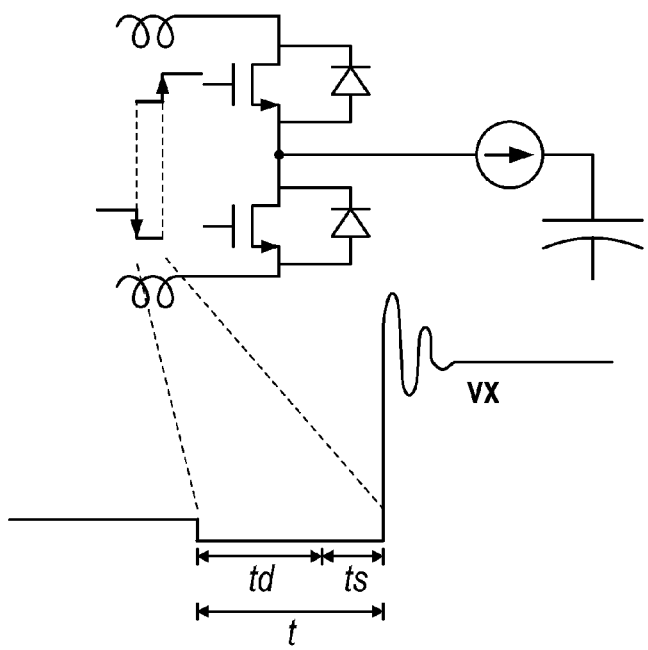
FIG. 3 is a graph demonstrating the deadtime of a traditional buck converter.

The total amount of the diode recovery loss depends upon the output current, the parasitic inductance, and the high side drive capability. As shown in FIG. 3, the total deadtime t includes both the intrinsic deadtime $t_d$ and the reverse recovery time $t_s$. The reverse recovery time $t_s$ can account for a large fraction, e.g. more than 25% of the deadtime of the transistor.

Figure 4:
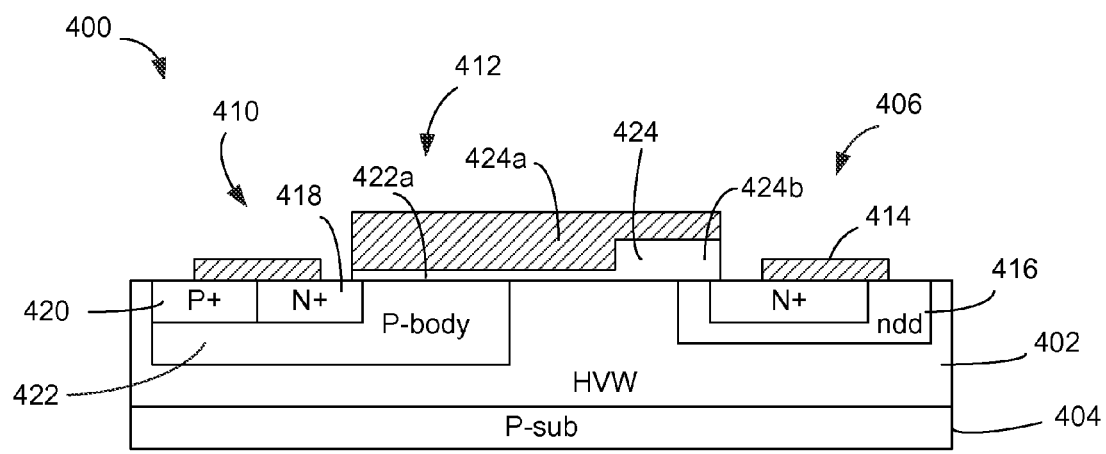
FIG. 4 is a schematic of an LDMOS transistor.

FIG. 4 shows a schematic cross-sectional view of an LDMOS transistor 400 that could be used, for example, as a transistor in a buck converter, e.g., as the low side transistor 42, as discussed above. The LDMOS transistor 400 can be fabricated on a high voltage n-type well 402 implanted in a p type substrate 404. A high voltage n-well implant is typically a deep implant and is generally more lightly doped relative to a CMOS n-well. The LDMOS transistor 400 includes a drain region 406, a source region 410, and a gate 412 with a stepped gate oxide layer 424. The drain region 406 includes a doped n+ region 414 and an n doped shallow drain 416. The source region includes an n-doped n+ region 418, a p-doped p+ region 420, and a p-doped p-body 422. The impurities that provide the n-well 402, the n-doped shallow drain 416, and the n+ regions 414, 418 are a first type of doping material, for example phosphorous. Both the n-doped shallow drain 416 and the n-well 402 have lower concentrations of impurities than the n+ regions 414, 418. Likewise, the impurities that provide the p+ region 420 and the p-body 422 are a second opposite type of doping material, for example boron. The p-body 422 can be self-aligned with the gate 412. In other words, the source-side edge of the gate and the gate-side edge of the p-body can be substantially aligned (subject to implantation effects that can force a portion of the p-body 422 below the gate). Alternatively, the p-body 422 need not be self-aligned with the gate 412.

Figure 5A:
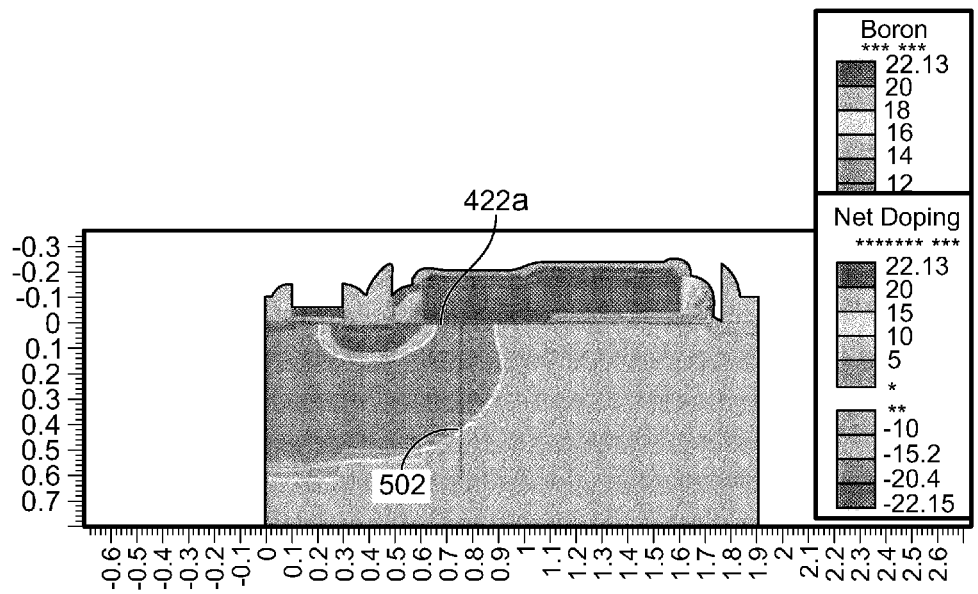
FIGS. 5A and 5B are schematics of an exemplary impurity profile in a transistor as described herein.
Figure 5B:
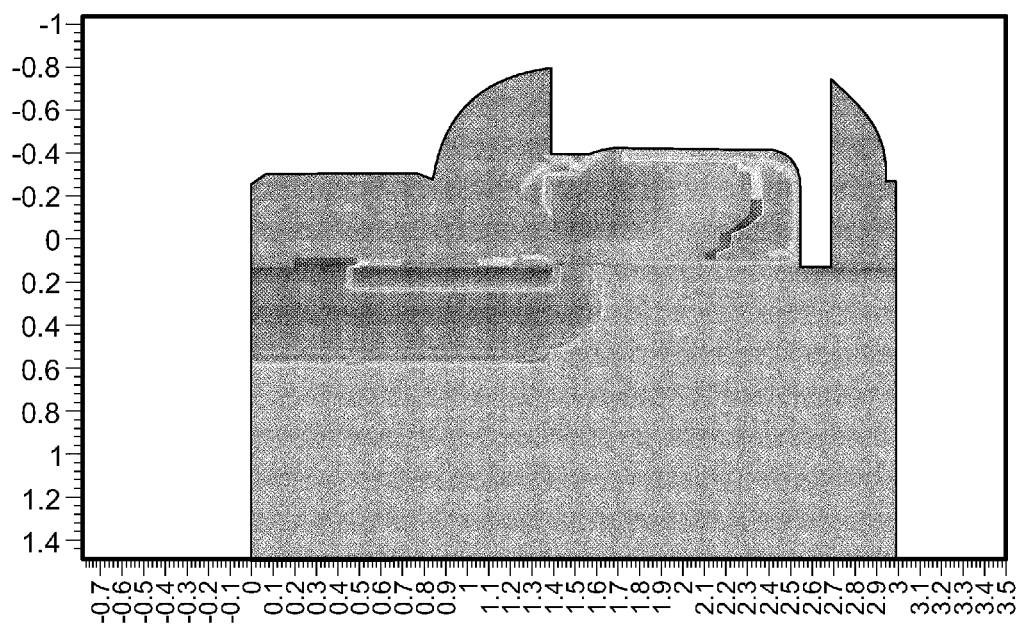

The p-body can have a maximum doping concentration of, for example, $1 \times 10^{17}$ atoms/cm$^2$ to $1 \times 10^{18}$ atoms/cm$^2$. Moreover, the doping concentration at the top surface 422a of the p-body can be less than about $5 \times 10^{17}$ atoms/cm$^2$, such as less than $3 \times 10^{17}$ atoms/cm$^2$, for example $2 \times 10^{17}$ atoms/cm$^2$. Exemplary doping profile is shown in FIGS. 5A and 5B.

Referring back to FIG. 4, the oxide layer 424 is located underneath the gate 412 and includes two portions, thin portion 424a and thick portion 424b. Thin portion 424a can be closer to the source 410 than thick portion 424b and can partially overlap the n+ region 418 and the p-body 422. Thick portion 424b can be closer to the drain 406 than thin portion 424a and can partially overlap the n+ region 414 and the shallow drain 406. As shown in FIG. 4, thin portion 424a can be thinner than thick portion 424b. Thin portion 424a can be less than 100 Å thick, such as less than 40 Å thick, for example 35 Å. In contrast, thick portion 424b can be at least five times as thick as the thin portion 424a, such as at least 10 times as thick, for example between 200 Å and 400 Å thick.

For the LDMOS transistor 400, a high enough positive voltage on the gate 412, called the turn-on voltage ($V_t$), will push the positive holes of the p-body 422 away from the gate 412 to form a depletion layer. This will create a channel for electrons (n) (an "n-channel") to flow between the source 410 and the drain 406. Varying the voltage between the gate 412 and the substrate 404 modulates the conductivity of the n-channel and makes it possible to control the current flow between drain and source.

The thin portion 424a of the oxide layer 424, in combination with having a p-body profile as described above, can affect the turn-on voltage ($V_t$) of the gate and transistor. As the thin portion 242a is made thinner, the turn-on voltage will be reduced. Further, the lower the concentration of the p-body, the lower the turn-on voltage.

By appropriate selection of the thickness of the thin portion of the oxide layer and reducing the concentration of the p-body, the turn-on voltage ($V_t$) of the transistor can be less than the turn-on voltage ($V_{be}$) of the intrinsic diode. For example, the turn-on voltage of the transistor can be less than 0.6V. Advantageously, by making $V_t$ less than $V_{be}$ for the low-side transistor of a buck converter, the transistor can enter third-quadrant conduction during deadtime, causing current to travel through the transistor instead of the body diode.

Lowering $V_t$ such that the current goes through the transistor instead of the body diode can eliminate the reverse recovery time, thereby greatly enhancing the efficiency of the buck converter. Additionally, power is saved because there is no need to discharge the minority carriers that would otherwise form the reverse recovery charge on the body diode during reverse conduction. If the turn-on voltage of the transistor is too low, however, the ringing caused by switching between the high-side transistor and low-side transistor can unintentionally activate the gate. Therefore, the thickness of the thin portion and the concentration of the p-body can be balanced such that the turn-on voltage of the transistor is between 0.4V and 0.5V.

Figure 6:
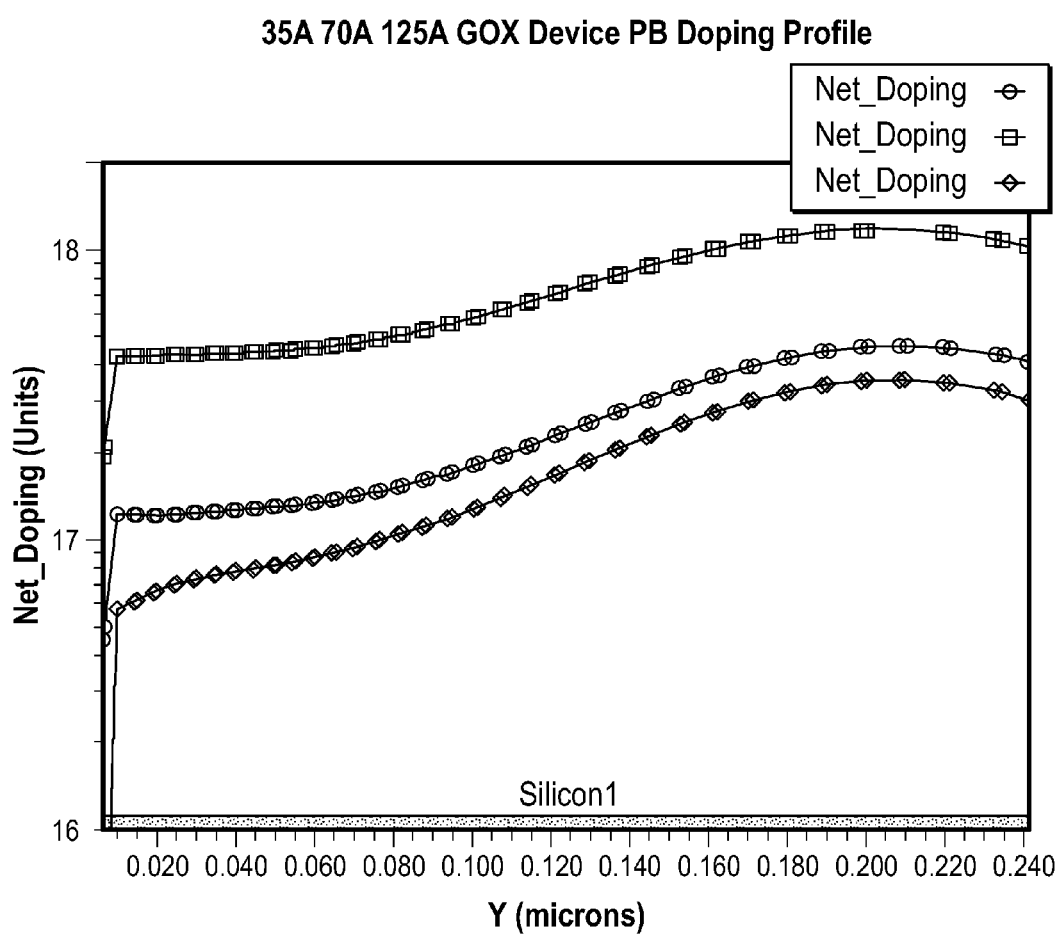
FIG. 6 is a graph of doping vs. distance from the surface for a transistor having a thin gate oxide thickness of 35 Å, 70 Å, and 125 Å, respectively.
Figures 8A, 8B:
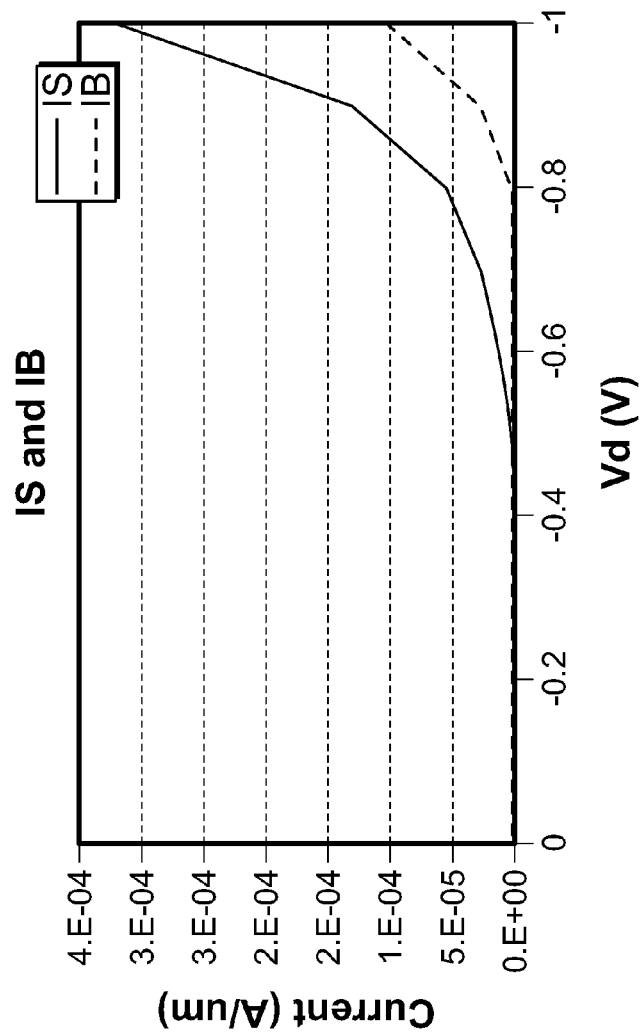
FIGS. 8A and 8B are a chart, and corresponding graph, showing the characteristics of a transistor having a thin gate oxide thickness of 70 Å.

FIG. 6 shows an exemplary graph of net doping vs. distance into the p-body from a top surface of the p-body 422a (along the line 502 from FIG. 5). In the exemplary embodiments shown in FIG. 6, a thin oxide layer of 35 Å requires a surface doping concentration of approximately $2 \times 10^{17}$ atoms/cm$^2$. A thin oxide layer of 70 Å requires a surface doping concentration of approximately $5 \times 10^{16}$. Moreover, a thin oxide layer of 125 Å requires a surface doping concentration of less than $1 \times 10^{16}$. Therefore, the thinner the thin oxide layer is, the greater the maximum doping concentration can be to achieve a $V_t$ that is less than $V_{be}$.

Figures 9A, 9B:
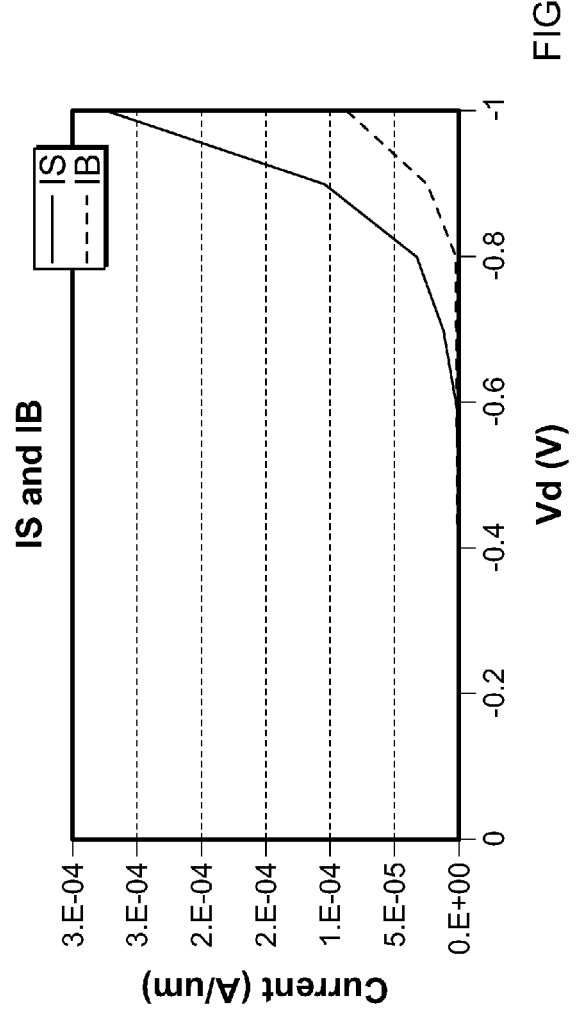
FIGS. 9A and 9B are a chart, and corresponding graph, showing the characteristics of a transistor having a thin gate oxide thickness of 125 Å.

As shown in the exemplary embodiments of FIGS. 7A-8B, a device having a thin oxide, e.g. less than 100 Å, such as 35 Å (FIGS. 7A-7B) or 70 Å (FIGS. 8A-8B), and the proper p-body concentration, a current through the transistor (IS) can be much greater than the current through the diode (IB). Moreover, provided that the applied voltage is between approximately 0.4V and 0.8V, no current will go through the diode. However, referring to FIGS. 9A and 9B, if the thin oxide thickness rises to above 100 Å, such as 125 Å, then a much smaller voltage window, e.g. between 0.65 and 0.8V is available in which no current goes through the diode. Moreover, more doping steps are required to get the necessary p-body concentration.

Varying the Vt of the low-side transistor requires additional semiconductor processing steps. To achieve a Vt of approximately 0.4 V, it is helpful to fashion the transistor so that the oxide beneath the gate is thinner where it contacts the source of the transistor than where it contacts the drain of the transistor because the thinner the oxide, the lower the Vt for a given surface doping. This thin oxide is not suitable for the drain side of the gate, however, because it would compromise the breakdown voltage (BVDSS) of the transistor. Accordingly, the must be shaped as a "step," with the drain side being thicker than the source side.

Figure 10A:
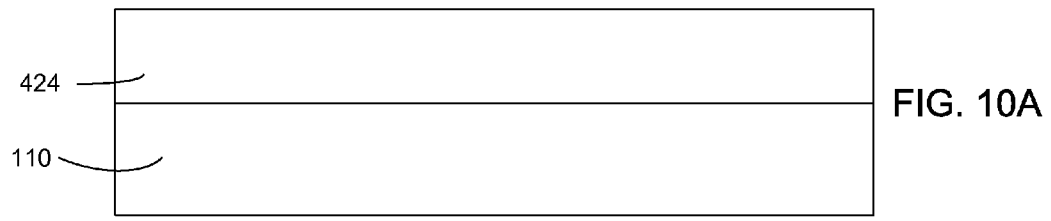
FIGS. 10A-10K show an exemplary process of forming a transistor.

Referring to FIG. 10A, the process of making the transistor begins by forming an oxide layer 424 on a silicon layer 110.

Figure 10B:
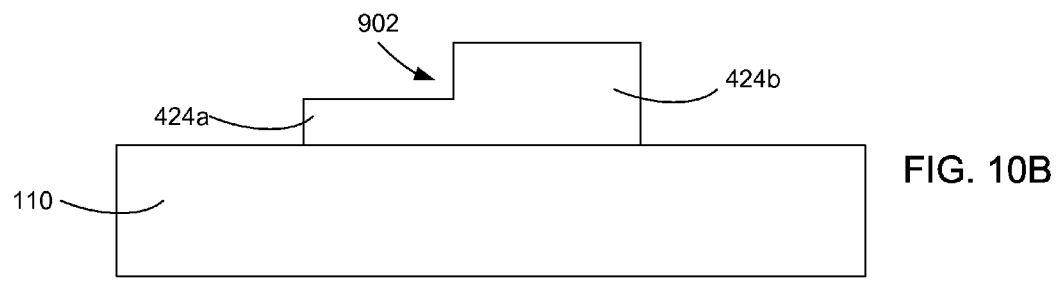

Referring to FIG. 10B, the oxide layer is patterned to define the gate oxide regions. In addition, a step 902 is formed in the oxide layer 424, creating a thin oxide portion 424a and a thick oxide portion 424b. The thin oxide portion 424a can be on the source side of the gate, whereas the thick oxide portion 424b can be on the drain side of the gate. The step 902 could be formed before or after the oxide layer is patterned. The thin oxide portion 424a can also be deposited simultaneously on any CMOS devices on the substrate, e.g., using a single mask.

In some implementation, the step 902 in the oxide can be formed by growing a thin oxide layer, masking the substrate (including the thin portion 424a) except for where the thick portion is desired, and depositing, e.g., using chemical vapor deposition, the remaining oxide in the unmasked area to form the thick portion 424b. In other implementations, the step 902 can be formed by growing a thick oxide layer, masking the substrate (including the thick portion 424b) except where the thin portion is desired, etching the exposed portion of the oxide layer down to the silicon layer, and growing the thin oxide layer 424a in the region that was etched away, e.g., using the same mask that was used in the etching step. In either process, the mask can then be removed.

Figure 10C:
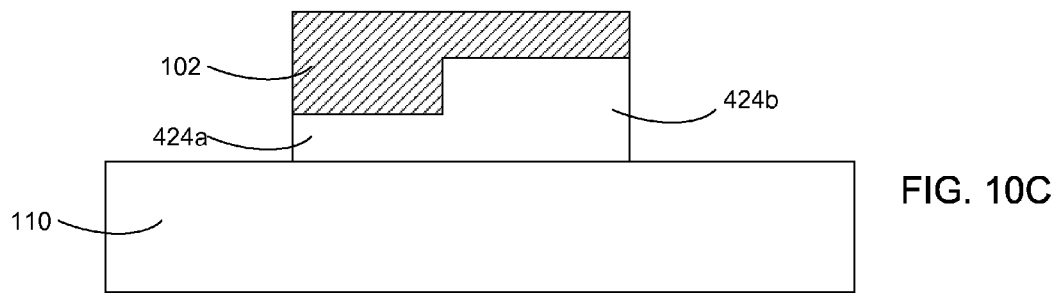

Referring to FIG. 10C, the gate conductor 102, e.g. a polysilicon layer, is applied over the oxide layer 424. The gate conductor, e.g. polysilicon layer, can be approximately 0.2-0.5 μm thick depending on the base process technology node.

The gate conductor 102 can also be deposited simultaneously on any CMOS devices on the substrate, e.g., using a single mask.

Figure 10D:
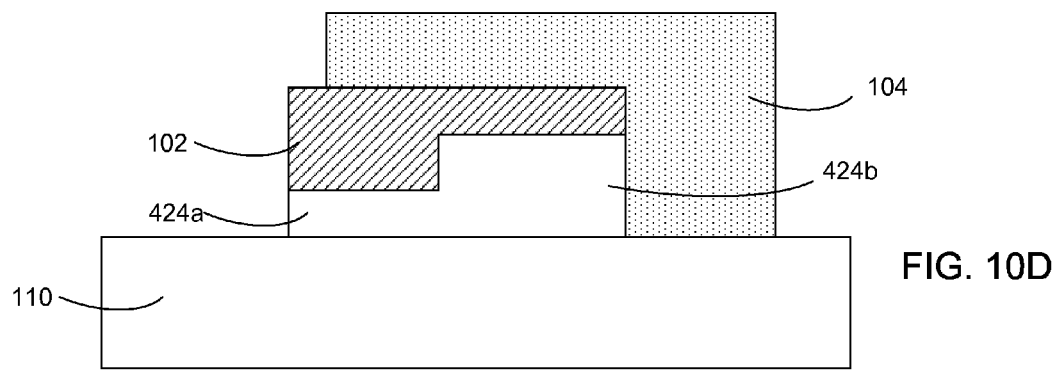

Referring to FIG. 10D, photoresist 104 is deposited, e.g., by spin coating, over the gate conductor 102, and patterned to expose at least the source side of the transistor. The photoresist can have a thickness of greater than 0.5 μm. Optionally, some portions of the gate conductor 102 on the source side 120 can also be exposed.

Figure 10E:
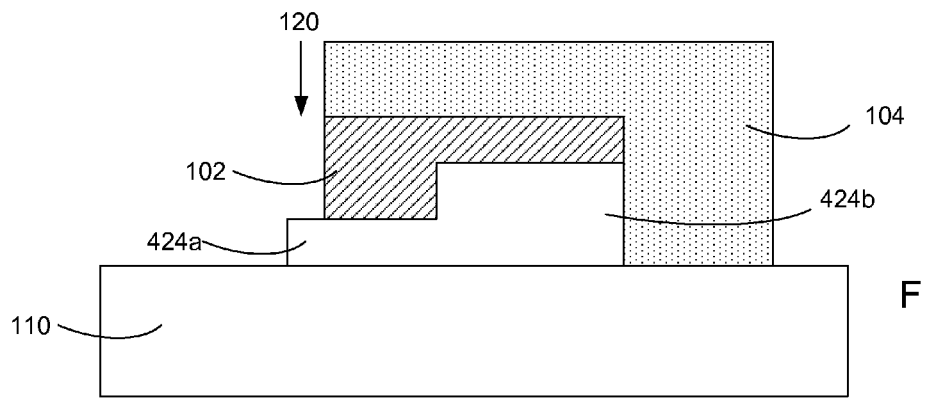

Referring to FIG. 10E, the exposed portion of the gate conductor 102 on the source side 120 of the transistor is then removed by etching using the photoresist 104 as a mask, e.g., using dry plasma ecthing. The photoresist 104 can thus act as a mask during the etch.

Figure 10F:
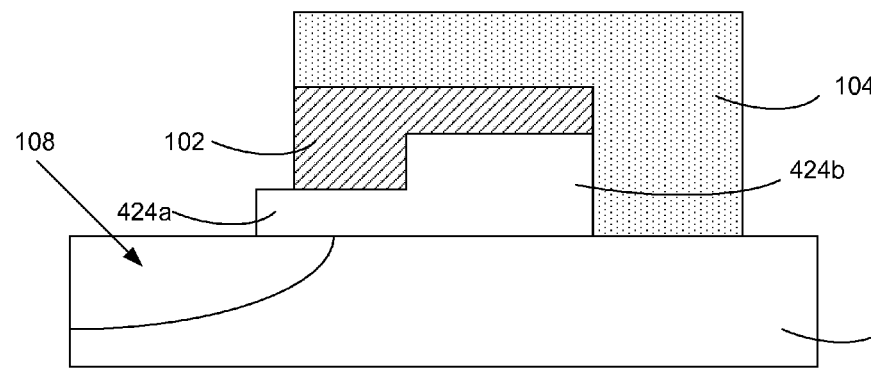

Referring to FIG. 10F, the p-body 422 is implanted using the combined photoresist 104 and remaining gate conductor 102 as a mask. The p-body 422 is implanted by bombarding the surface of the oxide 424a with the implant atoms. The implant can be performed at an angle to the main surface of the oxide 424a (shown by arrow 108). Because both the gate conductor 102 and the photoresist 104 are used as a mask, the resulting p-body 422 can be self-aligned to the gate, particularly to the source side of the gate conductor.

Figure 10G:
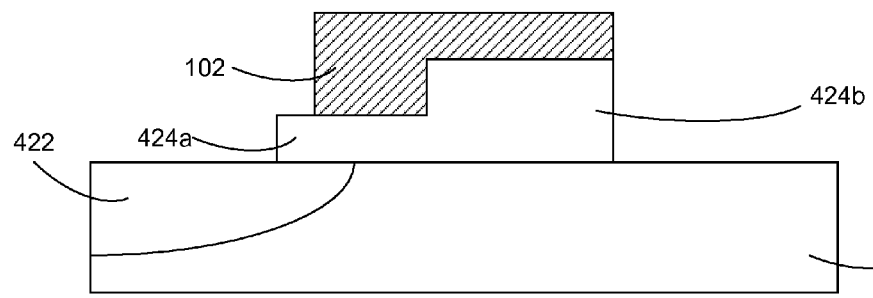

Referring to FIG. 10G, the photoresist layer 104 is then stripped from the surface.

Figure 10H:
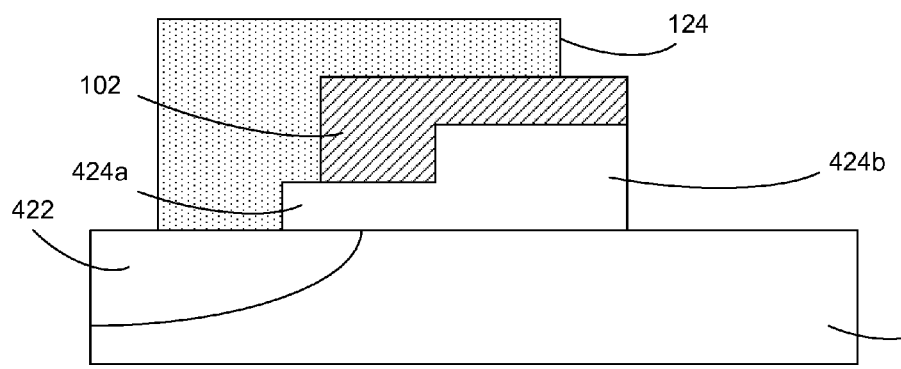

Referring to FIG. 10H, a new layer of photoresist 124 is applied, e.g., by spin coating, over the exposed surfaces, including the exposed portion of the oxide layer 424a on the source side 120 following the etch of the gate conductor 102 on the source side 120. The photoresist layer 104 is patterned to expose at least the drain side of the transistor. Optionally, some portions of the gate conductor 102 on the drain side 122 can be exposed.

Figure 10I:
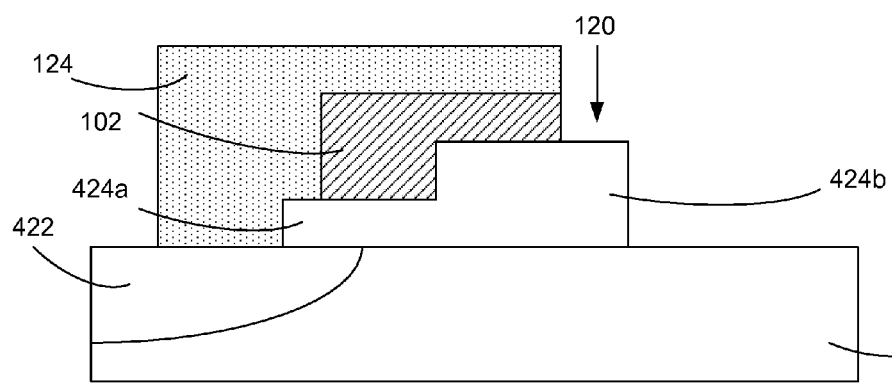

Referring to FIG. 10I, the exposed portion of the gate conductor on the drain side 122 is then removed by etching, e.g., dry plasma etching, using the photoresist 124 as a mask. The photoresist 124 also serves to protect the implanted p-body on the source side 120 during the etching process.

Figure 10J:
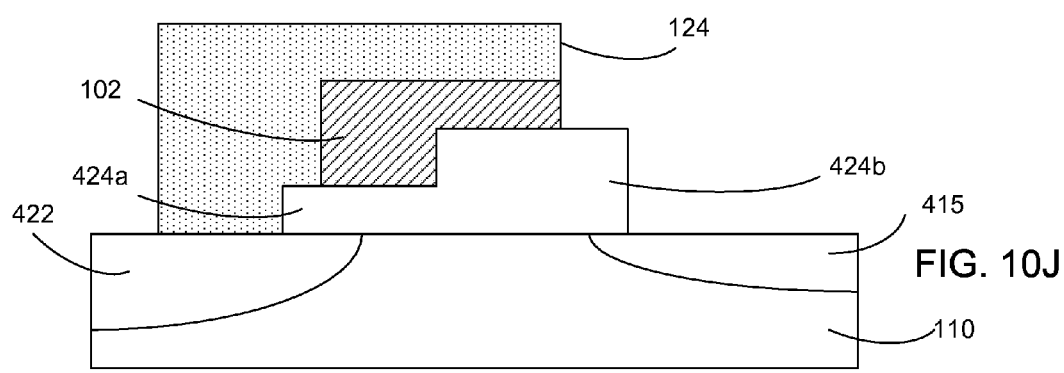

Referring to FIG. 10J, the NDD 415 can be implanted using the combined photoresist 124 and remaining gate conductor 102 as a mask. Because both the gate conductor 102 and the photoresist 124 are used as a mask, the NDD 415 can be self-aligned to the gate, particularly to the drain side of the gate conductor.

Figure 10K:
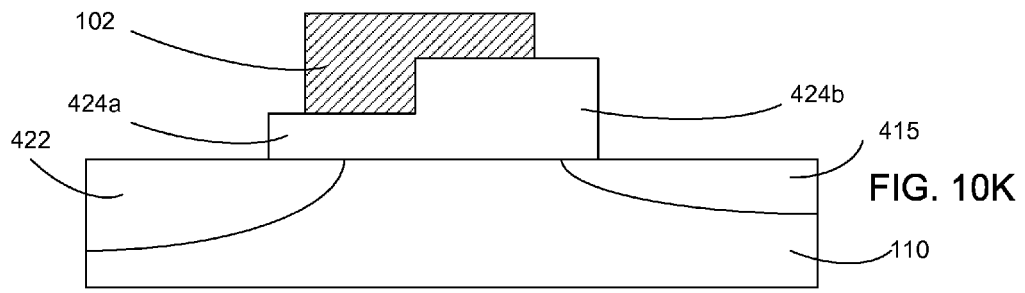

Referring to FIG. 10K, the photoresist 124 is then removed.

The p+ and n+ regions 414, 418, 420, can be implanted by conventional implanting processes, e.g., after the P-body 422 and NDD 415 have been implanted.

Although the fabrication of only one gate is illustrated in FIGS. 10a-10g, multiple gates, or the gate of a distributed transistor, can be fabricated simultaneously.

By including a photoresist layer over the polygate during the p-body implantation, a self-aligned p-body can be formed. Moreover, using the photoresist protects the remainder of the substrate from impurities caused during the implantation process. Further, by having two separate etching steps, before and after the implantation process, a single self-aligned p-body can be formed in the source side of the substrate.

Figure 11A:
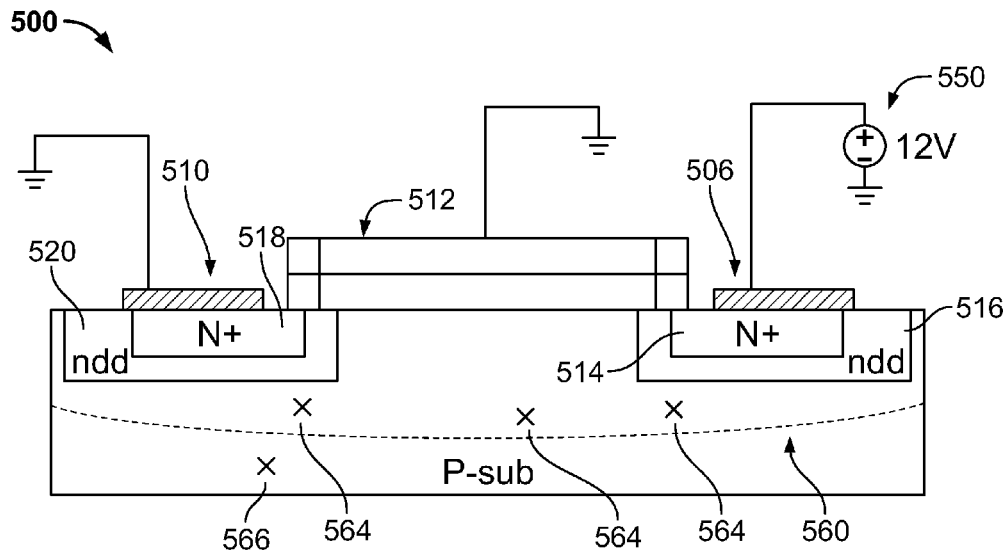
FIG. 11A is a schematic of prior art transistor during leakage testing.

FIG. 11A shows a schematic cross-sectional view of an prior-art transistor 500 that could be used, for example, as a transistor in a buck converter, e.g., as the low side transistor 42, as discussed above. The transistor 500 includes a drain region 506, a source region 510, and a gate 512. The drain region 506 includes a doped n+ region 514 and an n doped shallow drain 516. The source region includes an doped n+ region 518 and an n doped shallow drain 520. During testing of the transistor, a supply voltage 550 is applied to the drain 506, for example 12 V, and the gate 512 and the source 510 are connected to ground. As a result, depletion region 560 is formed in the transistor. If there are processing defects in the substrate of the transistor that fall within the depletion region, for example 564, such defects will be detectable by measuring the leakage current flowing from drain 506 to source 510, because they form generation/recombination centers. If the leakage current is higher or lower than expected, the likelihood of a processing defect is increased. Such defects may be the result of misplaced dopants, or a break in the lattice structure of the underlying substrate. If there are processing defects in the substrate of the transistor that fall outside the depletion region, for example 566, such defects may not be detectable by measuring the leakage current flowing from drain 506 to source 510. It is possible that a higher supply voltage 550 might cause a larger depletion region that would encompass defects such as 566, and therefore make them detectable through leakage measurements. Alternatively, if the transistor is subject to an electrical overstress (EOS) event during assembly or testing, it can compromise the rating of the part. Such events also change the transistor's leakage characteristic.

Figure 11B:
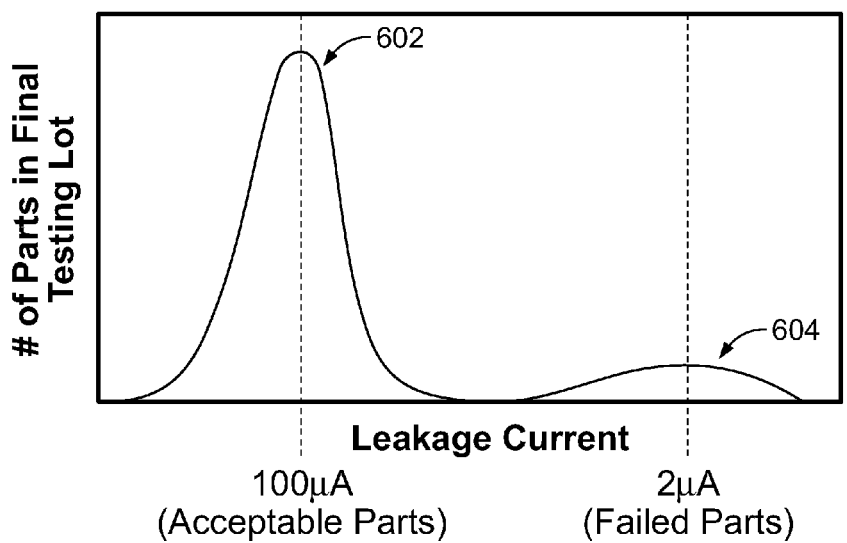
FIG. 11B is a histogram showing the distribution of leakage currents of a group of prior-art transistors.

FIG. 11B shows a histogram 600 of leakage measurements for a group of prior-art transistors. As shown in the first concentration of transistors 602, most of the transistors exhibit an average leakage measurements of, for example, 500 nA±50 nA. Such transistors could be deemed "passing" in production testing, because they exhibit leakage current that is within an expected range. As shown in the second concentration of parts 604, some transistors exhibit leakage measurements of, for example, 2 μA. Such a higher leakage current may be symptomatic of defects in the transistor substrate, such as 564. Transistors that exhibit higher leakage currents could be deemed "failing" in production testing, because they exhibit leakage current that is outside the expected range, and therefore have reduced reliability and elevated risk of failure due to catastrophic short-circuit during operation.

Figure 11C:
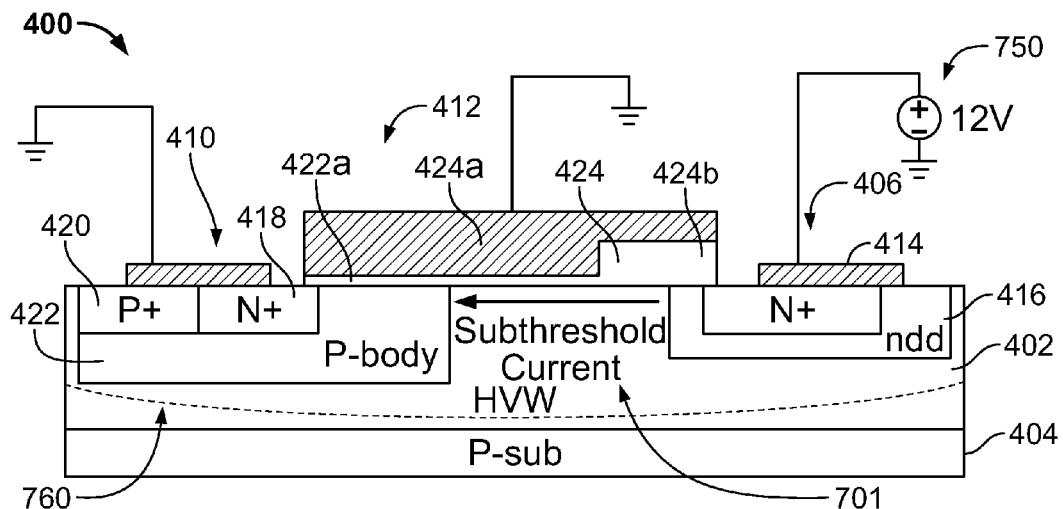
FIG. 11C is a schematic of an LDMOS transistor during leakage testing.

FIG. 11C shows an embodiment of a transistor with lowered turn-on voltage $V_t$, i.e., a device with a turn-on voltage ($V_t$) that is less than the turn-on voltage ($V_{be}$) of the intrinsic diode, undergoing a conventional testing procedure. During testing of the transistor, a supply voltage 750 is applied to the drain 406, for example 12 V, and the gate 412 and the source 410 are connected to ground. As a result, depletion region 760 is formed in the transistor. Directly beneath the gate 412 is shown a subthreshold current 701. This subthreshold current flows between the drain 406 and the source 410 when the supply voltage 750 is present. In some embodiments, the subthreshold current is the result of the wafer processing steps that achieve lowered turn-on voltage. The subthreshold current could be, for example, 1-3 μA. A subthreshold current of this magnitude could prevent effective measurement of the leakage current of the transistor. The subthreshold current, because it is several times higher than the leakage current, could dilute the leakage measurement, making defective transistors indistinguishable from acceptable transistors.

Figure 11D:
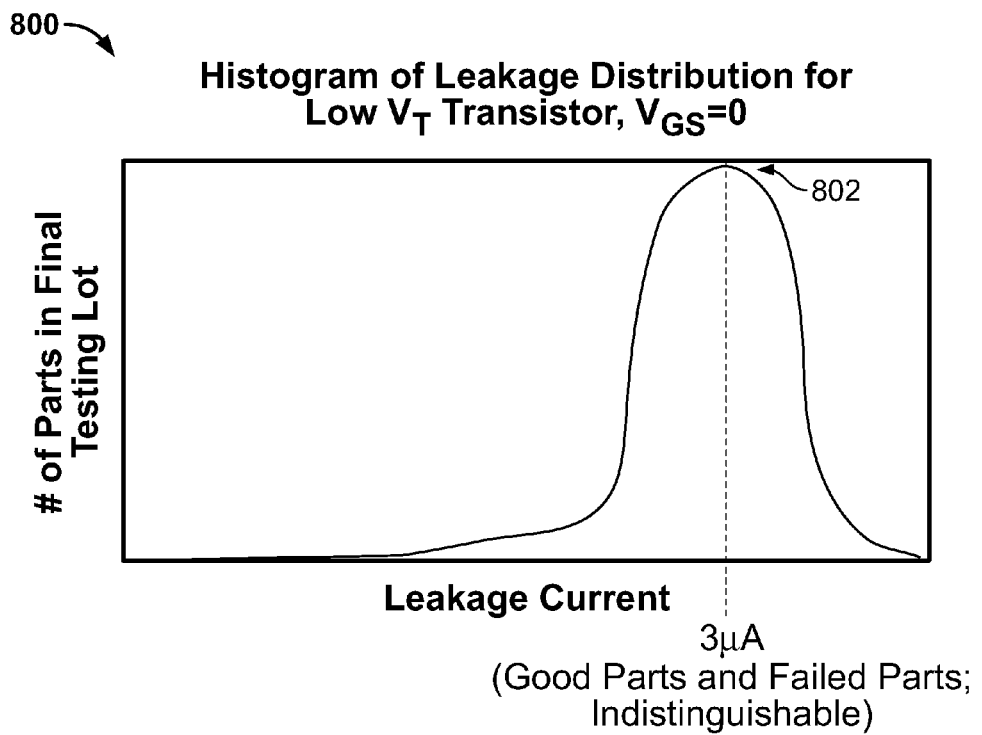
FIG. 11D is a histogram showing the distribution of leakage currents of a group of LDMOS transistors.

FIG. 11D shows a histogram 800 of leakage measurements for a group of transistors designed and tested in accordance with, for example, FIG. 11C. As shown in the concentration of parts 802, the transistors exhibit leakage current of approximately 3 μA. This includes transistors that have defects, as well as transistors that do not have defects.

Figure 11E:
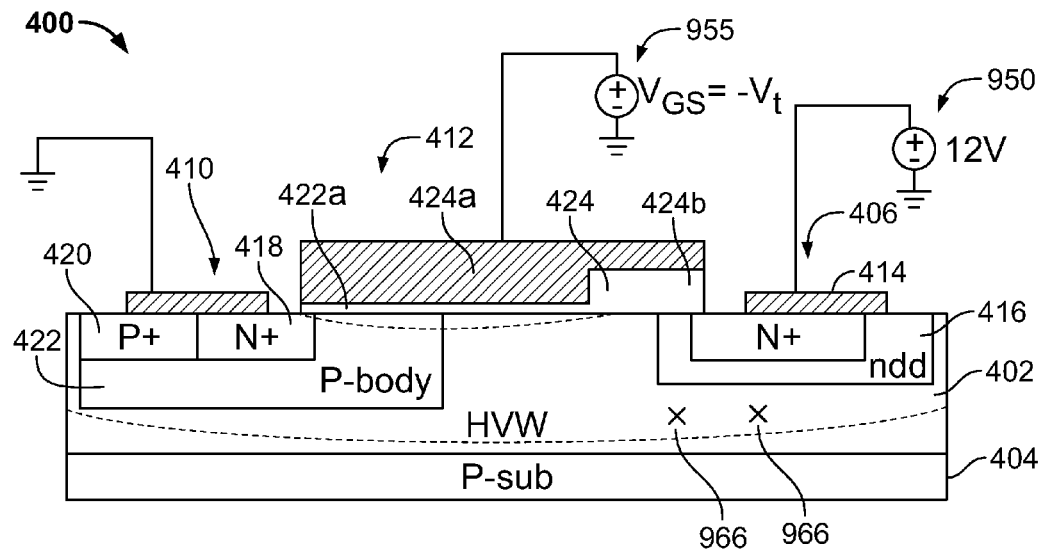
FIG. 11E is a schematic of an LDMOS transistor during leakage testing.

FIG. 11E shows an embodiment of an LDMOS transistor with lowered turn-on voltage $V_t$, i.e., a device with a turn-on voltage ($V_t$) that is less than the turn-on voltage ($V_{be}$) of the intrinsic, undergoing a modified testing procedure. During testing of the transistor, a supply voltage 850 is applied to the drain 406, for example 12 V. The source 410 is connected to ground. The gate 412 is connected to a supply voltage 955, for example $-V_t$.

The negative voltage at the gate creates an effective depletion region beneath the gate, pushing minority carriers away. This can reduce the subthreshold current flowing between the drain 406 and the source 410. If defects are present, such as defects 966, the resulting current that flows to the substrate can be accurately measured due to the absence of subthreshold current beneath the gate 412.

Figure 11F:
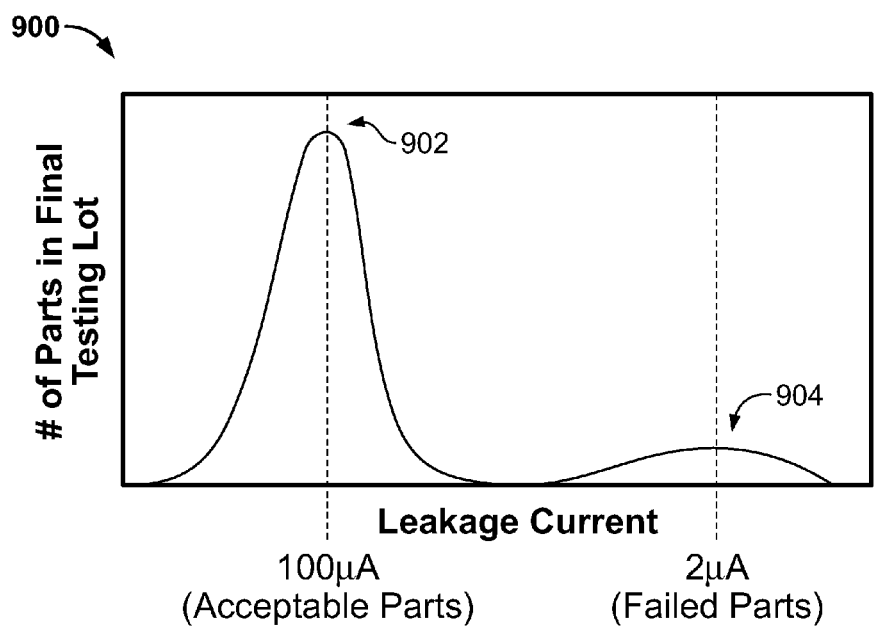
FIG. 11F is a histogram showing the distribution of leakage currents of a group of LDMOS transistors.

FIG. 11F shows a histogram 900 of leakage measurements for a group of transistors designed and tested in accordance with, for example, FIG. 11E. As illustrated, a group of transistors tested for leakage current can exhibit the histogram 900 that is similar to the histogram 600 of FIG. 11B, with a clear demarcation between "passing" and "failing" transistors. In particular, the histogram can exhibit a sharp peak 902 centered around a low current, e.g., 100 microamperes. In addition, the histogram can exhibit one or more other lower and broader peaks 904, e.g., centered around 2 μA.

Figure 11G:
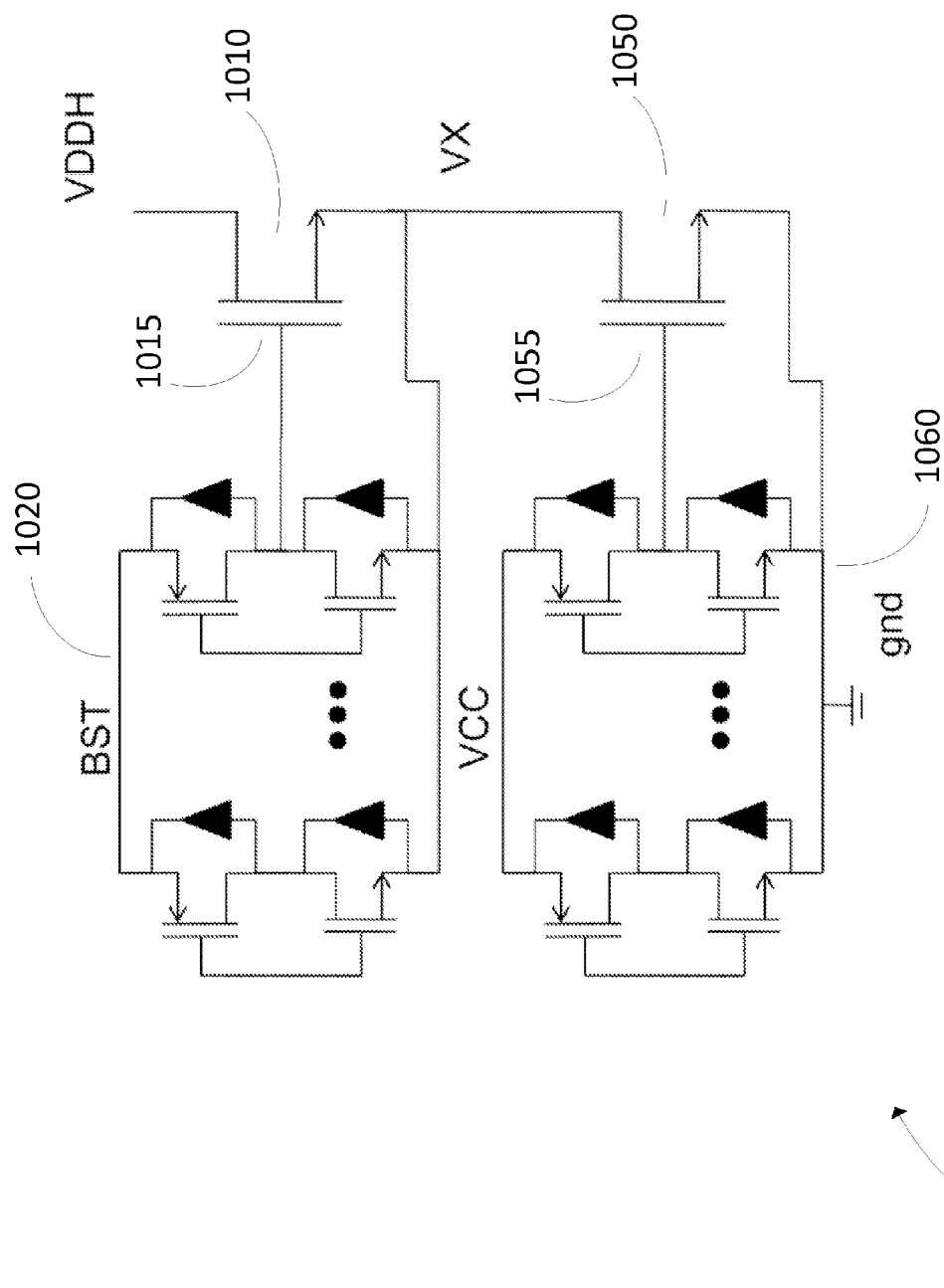
FIG. 11G is a simplified circuit diagram of a switching regulator.

FIG. 11G shows an embodiment of a switching regulator 1000 in which the high-side transistor 1010 has its gate 1015 tied to driver circuit 1020, and the low-side transistor 1050 has its gate 1055 tied to driver circuit 1060. In this embodiment, the gate nodes 1015 and 1055 may be inaccessible from the outside of the chip. In order to apply a negative voltage to the gate of transistors 1010 or 1050, a negative voltage can be applied to the power supply of driver 1020 the power supply of driver 1060.

Figure 12:
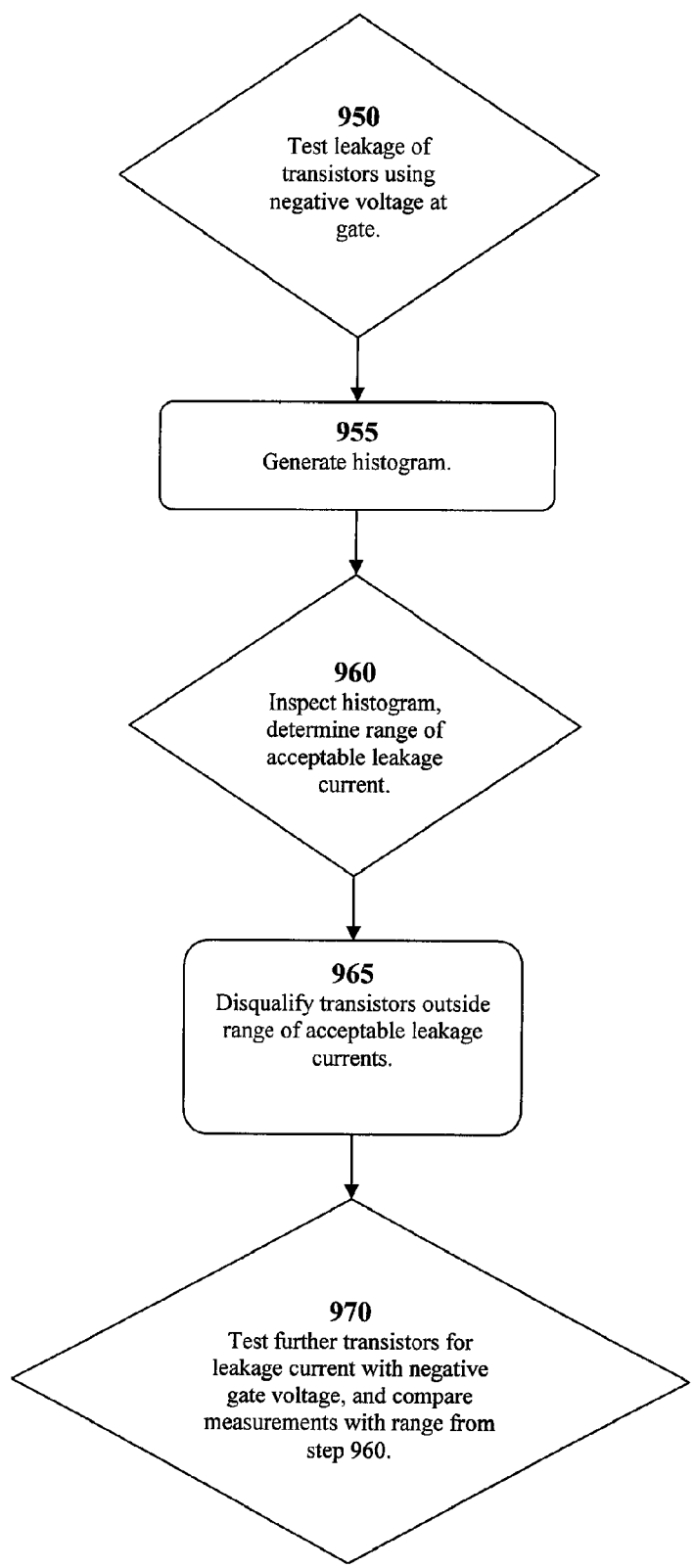
FIG. 12 is a flowchart of a process for testing LDMOS transistors.

FIG. 12 is a flow chart with an exemplary method of testing a lowered turn-on voltage LDMOS transistor, i.e., a device with a turn-on voltage ($V_t$) that is less than the turn-on voltage ($V_{be}$) of the intrinsic. In particular, a group of lowered turn-on voltage LDMOS transistors of the same design, i.e., with the same layout, doping, fabrication process, etc., but fabricated on different dies, can be tested using a negative voltage at the gate (step 950) and a histogram of leakage current measurements generated (step 955). In the context of LDMOS transistors that will serve as power switches, e.g., in a voltage regular, each transistor can be a distributed transistor, e.g., with a channel width of one meter or more. The transistor manufacturer can then inspect the histogram, and determine a range of acceptable leakage current (step 960). In general, the range of acceptable leakage current can correspond to the sharp peak at the expected leakage current, e.g., values within one or two standard deviations of the center of the sharp peak 902. For example, the acceptable range could have a width of 100 nanoamperes and be centered at about 500 nanoamperes. Tested transistors from the group that are outside the range of acceptable leakage current can be deemed "defective" and can be discarded (step 965). In addition, once the histogram is established in step 955 from the initial group of transistors, further transistors of the same design, i.e., with the same layout, doping, fabricated processes, etc., can be tested using a negative voltage at the gate (step 970), and a decision on whether the further transistors are acceptable or are deemed defective can be made based on a comparison of measured leakage current for the further transistors to the previously established range of acceptable leakage current (from step 960).

In some implementations, a single die includes two power switches, e.g., a high-side LDMOS transistor and a low-side LDMOS transistor, so that the die can be tested once for the high-side LDMOS transistor and once for the low-side LDMOS transistor. The leakage tests for the high-side LDMOS transistor and a low-side LDMOS transistor can be analyzed separately; the low-side LDMOS transistor can have a different histogram and range of acceptable leakage current than the high-side LDMOS transistor, e.g., due to being larger and have different parasitic structures.

In some embodiments, leakage tests can be performed by automated test equipment as a quality control for integrated circuits that include transistors. The automated test equipment can perform further tests in addition to transistor leakage tests, in order to identify defects. Any integrated circuit that is determined to be defective by the automated test equipment can be discarded. Moreover, any integrated circuit that is determined to require adjustment or alteration by the automated test equipment can be immediately altered through "trimming." Trimming is the adjustment of circuit properties through mechanical, electrical or other stimulus. In particular, trimming can be used to modify an integrated circuit in order to shift the circuit properties into specification. One example of trimming would be blowing specific fuses on the integrated circuit. Another example would be altering a programmable read-only memory (PROM) on the chip. Yet another example would be physically severing a conductive trace on the integrated circuit. The process of trimming can salvage integrated circuits that would otherwise fail to meet their design criteria. Trimming can also be performed to encode information on an integrated circuit during testing. For example, a serial number could be trimmed.

Particular embodiments have been described. Other embodiments are within the scope of the following claims. For example, an embodiment of the invention could use the LDMOS transistor with a vertical gate disclosed in U.S. Provisional Patent Application No. 61/522,429, filed Aug. 11, 2011.

What is claimed is:

1. A method of characterizing during a production test an N-Channel, lateral double-diffused metal oxide semiconductor (LDMOS), silicon, power transistor having a gate and a channel between a source and a drain, with a threshold voltage greater than zero volts, comprising:
    applying a negative voltage to the gate of the transistor;
    applying a positive voltage across the channel of the transistor;
    measuring a leakage current through said channel of said transistor while applying the negative voltage to the gate of the transistor and applying the positive voltage across the channel of the transistor; and
    determining whether the transistor is deemed defective based upon the leakage current measurement;
    wherein the characterization is performed as part of a production test; and
    the transistor has a threshold voltage lower than a turn-on voltage of an intrinsic diode of the transistor.

2. The method of claim 1, wherein the transistor has a threshold voltage between 0.4 Volt and 0.5 Volt.

3. The method of claim 1, wherein the transistor has a channel width of at least one meter.

4. The method of claim 1, wherein determining whether the transistor is deemed defective includes comparing the measured current to a threshold.

5. The method of claim 4, wherein determining whether the transistor is deemed defective includes determining whether the measured current is within an acceptable range.

6. The method of claim 5, further comprising,
    applying the negative voltage to gates of a plurality of transistors;

applying the positive voltage across channels of the plurality of transistors;

measuring a plurality of currents through said channels while applying the negative voltage to the gates and applying the positive voltage across the channels; and determining the acceptable range from the plurality of current measurements.

7. The method of claim 6, wherein determining the acceptable range includes identifying a distribution in a histogram of the plurality of current measurements and selecting the threshold to exclude one or more current measurements of the plurality of current measurements that are outliers of the distribution.

8. The method of claim 1, further comprising the step of permanently altering, by electrical or other stimulus, circuits that reside on the same integrated circuit as said transistor.

9. The method of claim 1 further comprising discarding transistors deemed defective based upon the measurement.

\* \* \* \* \*